United States Patent
Hayashi (10) Patent No.: US 6,981,236 B2
(45) Date of Patent: Dec. 27, 2005

(54) METHOD FOR MODELING SEMICONDUCTOR DEVICE AND NETWORK

(75) Inventor: Hirokazu Hayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 234 days.

(21) Appl. No.: 10/668,261

(22) Filed: Sep. 24, 2003

(65) Prior Publication Data

US 2004/0210858 A1 Oct. 21, 2004

(30) Foreign Application Priority Data

Apr. 15, 2003 (JP) .............................. 2003-109670

(51) Int. Cl.⁷ ............................................. G06F 17/50
(52) U.S. Cl. .............................. 716/14; 716/1; 716/17; 716/19; 703/14; 257/351
(58) Field of Search ................................ 716/1, 14, 17, 716/19; 703/14; 257/351

(56) References Cited

U.S. PATENT DOCUMENTS 5,825,673 A 10/1998 Watanabe .................... 703/14
6,649,980 B2 * 11/2003 Noguchi .................... 257/351

FOREIGN PATENT DOCUMENTS

JP 09-082938 3/1997
JP 2000-260973 9/2000

* cited by examiner

Primary Examiner—Thuan Do
(74) Attorney, Agent, or Firm—Volentine Francos & Whitt, PLLC (57) ABSTRACT

A method for modeling a device and a network to be analyzed in a complex simulation. The modeling method includes a device extraction step for extracting the structure of each of a plurality of devices included in the network to create device models showing the individual extracted structures, a device connection step for connecting the respective device models through the intermediary of an insulating portion for cutting off the electrical connection between the respective device models, and a circuit connection step for connecting a network model showing the network portion, from which the plurality of devices extracted in the device extraction step have been excluded, to a predetermined device model among the connected device models.

6 Claims, 7 Drawing Sheets

(1) $\quad -\nabla \cdot (\varepsilon \nabla \psi) = q(ND - NA + p - n)$ (2) $\quad \partial n / \partial t + \nabla \cdot Jn = GR$ (3) $\quad \partial p / \partial t - \nabla \cdot Jp = GR$ (4) $\quad \begin{bmatrix} 1 & 0 & 1 \\ 0 & 1 & 0 \\ 0 & 0 & 1 \end{bmatrix} \begin{pmatrix} n \\ p \\ \psi \end{pmatrix} = \begin{pmatrix} n0 \\ p0 \\ \psi 0 + V1 \end{pmatrix}$ (5) $\quad \int \text{divJn}\, dv + \int \text{divjp}\, dv = i1$

(6) $\quad JA \cdot \Delta y1 + JB \cdot \Delta x1 + JC \cdot \Delta y1 = (Vext - \psi p1)/r1$ (7) $\quad \int \text{divJn}\, dv + \int \text{divjp}\, dv = i2$ (8) $\quad JC \cdot \Delta y1 + JD \cdot \Delta x2 + JE \cdot \Delta y1 = (Vext - \psi p2)/r2$ $\varepsilon$: DIELECTRIC CONSTANT
q: UNIT CHARGE
ND: DONOR CONCENTRATION
NA: ACCEPTOR CONCENTRATION
n: ELECTRON CONCENTRATION
p: POSITIVE HOLE CONCENTRATION
$\psi$: POTENTIAL
Jn: CURRENT DENSITY (ELECTRON)
Jp: CURRENT DENSITY (POSITIVE HOLE)
GR: NUMBER OF ELECTRONS (POSITIVE HOLES) GENERATED PER UNIT VOLUME PER UNIT TIME
n0, p0, $\psi$0: VALUES AT THERMAL EQUILIBRIUM
V1: EXTERNAL VOLTAGE

FIG. 7

METHOD FOR MODELING SEMICONDUCTOR DEVICE AND NETWORK

BACKGROUND OF THE INVENTION

1. Field of the Invention

The present invention relates to a method for modeling a device and a network to be analyzed to perform a complex simulation for analyzing in a complex manner a semiconductor device and a network that includes the device.

2. Description of the Related Art

There have been known a complex simulation to analyze in a complex manner the devices included in a network together with the network. This complex simulation combines a device simulation technique for analyzing the characteristics of a semiconductor device, such as a metal oxide semiconductor (MOS) transistor, on a device-by-device basis, and a circuit simulation technique for analyzing the characteristics of the entire network. This type of simulation techniques has been disclosed in patent literature, for example, Japanese Unexamined Patent Application Publication No. 09-082938 or Japanese Unexamined Patent Application Publication No. 2000-260973.

In a typical complex simulation, a device model formed by modeling the device to be analyzed two-dimensionally or three-dimensionally and a network model showing the remaining network portion are integrated, then the device model is analyzed by device simulation. Subsequently, the parameters obtained from the device analysis and the net list of the network prepared in advance are used to analyze the entire network by a circuit simulation. This makes it possible to know the characteristics of the device operated in the network. A source code for a complex simulation is usually created by modifying a general-purpose source code for device analyses and the modified general-purpose source code is integrated with a circuit analysis source code through the intermediary of an interface code.

When attention is focused on a plurality of devices of a network in a complex simulation, according to the prior arts, each device model is handled as a separate analysis region, and the device analysis is carried out on each region. For instance, in a two-dimensional complex simulation focused on a complementary MOS (CMOS) transistor using a pair of n-type and p-type MOS transistors (hereinafter referred to simply as "CMOS"), the n-type and the p-type MOS transistors are separately subjected to the device analysis.

However, when a plurality of devices is handled, it will be required to consider a plurality of device analysis regions when creating a source code. This inconveniently complicates the adjustment of the interface between the devices and circuit analyses, taking much time to create the source code.

SUMMARY OF THE INVENTION

The present invention has been made with a view toward solving the problem described above, and it is an object of the invention to provide a method for modeling a semiconductor device and a network for analyzing a plurality of devices by a complex simulation without complicating the creation of a source code.

The modeling method in accordance with the present invention is a method for modeling a device and a network to be analyzed in a complex simulation for analyzing, in a complex manner, a semiconductor device and a network that includes the device, the method including an extraction step for extracting the structure of each of a plurality of devices included in the network to create device models showing the individual extracted structures, a device connection step for connecting the respective device models through the intermediary of an insulating portion for cutting off the electrical connection among the respective device models, and a circuit connection step for connecting a network model showing the network portion, from which the plurality of devices extracted in the device extraction step have been excluded, to a predetermined device model among the connected device models.

In the device extraction step, two-dimensional models showing the sectional structures of the individual corresponding devices may be used as the device models. Alternatively, three-dimensional models showing the three-dimensional structures of the corresponding devices may be used as the device models.

In the device connection step, the device models can be connected through the conducting portion that permits partial conduction among the device models to be connected. Alternatively, the device models may be, for example, directly connected in part to form the conducting portion.

In the device connection step, a space portion may be formed to provide a gap between the device models to be connected.

An electrode potential setting step for setting potentials, which are different from each other, at a predetermined multiple potential points in an electrode of the device model to which the network portion has been connected may be added to the modeling method in accordance with the present invention.

DESCRIPTION OF THE PREFERRED EMBODIMENTS

The following will describe an embodiment according to the present invention in conjunction with a specific example.

FIRST SPECIFIC EXAMPLE

Figure 1:
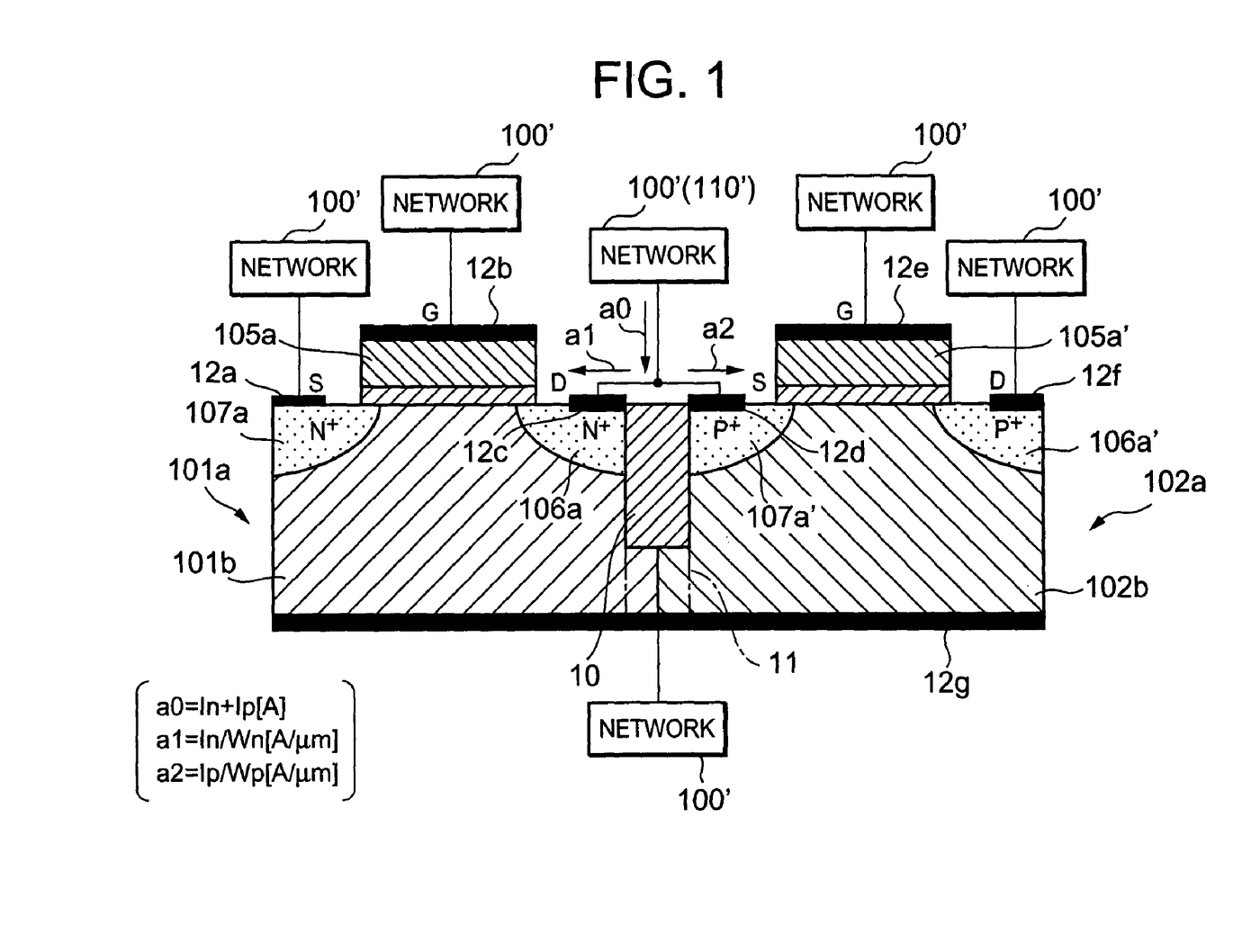
FIG. 1 is a schematic representation for explaining a first specific example of the modeling method according to the present invention.

FIG. 1 is a schematic diagram for explaining a first specific example of the modeling method in accordance with the present invention. The modeling method of the first specific example can be applied to the complex simulation that uses a two-dimensional device model showing the sectional structure of a device. The specific example illustrates the modeling example in which a complex simulation focused on a CMOS 100A of FIG. 2B that constitutes an inverter circuit in a network 100 shown in FIG. 2A.

Figures 2A, 2B:
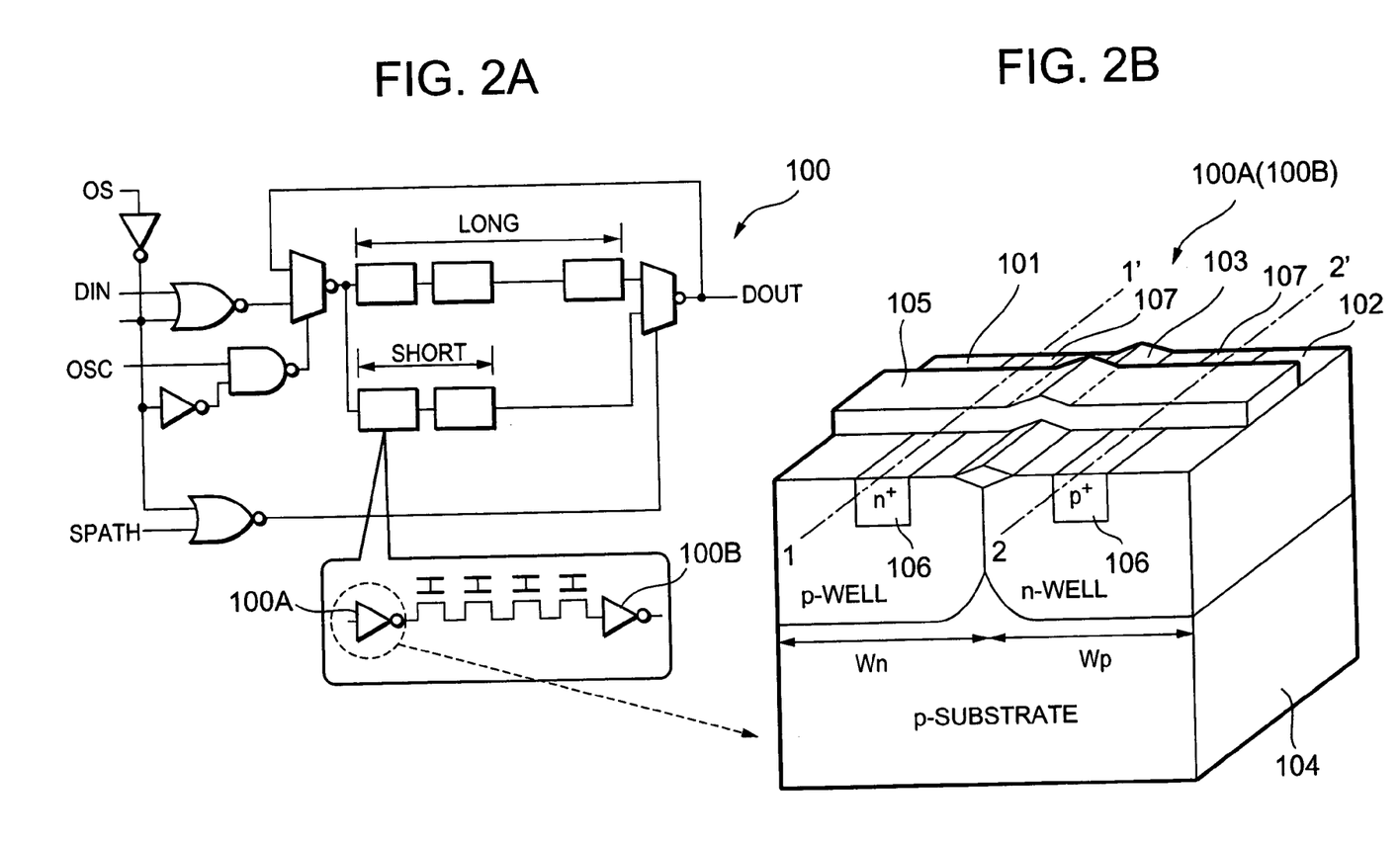
FIG. 2A and FIG. 2B are schematic representations for explaining a network and a CMOS in the specific example.

Referring to FIG. 2B, the CMOS 100A has an nMOS 101 having a channel width of Wn [$\mu$m] and a pMOS 102 having a channel width of Wp [$\mu$m], which are adjacently formed on a p-type semiconductor substrate 104 through the intermediary of a LOCOS oxide film 103 for isolating devices. In the illustrated example, the CMOS 100A is shown in a three-dimensional fashion for the purpose of explanation. The nMOS 101 and the pMOS 102 implement the functions of an n-type MOS transistor and a p-type MOS transistor that have conventionally well known.

Figure 3:
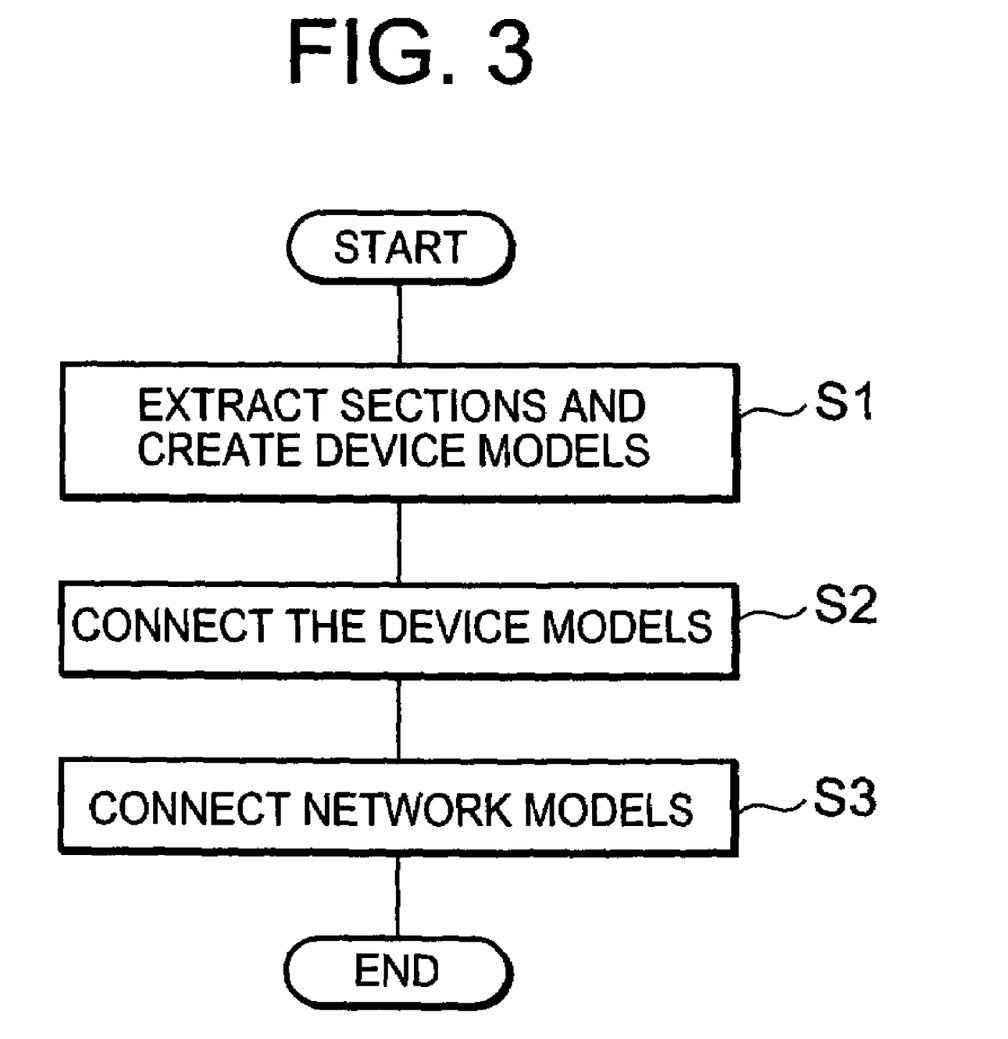
FIG. 3 is a flowchart showing a procedure of the modeling method of the first specific example.

The procedure of the modeling method according to the first specific example will be explained in conjunction with the flowchart shown in FIG. 3. The procedure according to the first specific example can be roughly individual into a device extraction step corresponding to step S1 shown in FIG. 3, a device connection step corresponding to step S2, and a circuit connection step corresponding to step S3.

In the device extraction step, the sectional structures of the nMOS 101 and the pMOS 102 are extracted on the basis of line 1–1' and line 2–2' that orthogonally cross a gate 105 extended over the nMOS 101 and the pMOS 102 in the CMOS 100A shown in FIG. 2B and that extend along drains 106 and sources 107 of the nMOS 101 and the pMOS 102, respectively. Thus, an nMOS model 101a and a pMOS model 102a that provide the two-dimensional device models showing the foregoing structures are created (step S1).

Then, in the device connection step, the two models are horizontally arranged such that a drain 106a of the nMOS model 101a and a source 107a' of the pMOS model 102a are adjacent to each other, as shown in FIG. 1. An insulating portion 10 for cutting off electrical connection between the two models is disposed between the nMOS model 101a and the pMOS model 102a. Furthermore, a conducting portion 11 that permits partial conduction between the two models is provided under the insulating portion 10 (step S2). Interconnecting the nMOS model 101a and the pMOS model 102a as described above makes it possible to handle the multiple models together as the same analysis region in a device analysis.

As the aforesaid insulating portion 10, a member, such as $SiO_2$ that can be handled as having zero dielectric constant, can be used. The size of the insulating portion 10 is preferably set appropriately such that the potentials of the drain 106a of the nMOS model 101a and a source 107a of the pMOS model 102a do not affect each other.

In the illustrated example, the portion where a p well 101b of the nMOS model 101a and an n well 102b of the pMOS model 102a are directly connected in part provides the conducting portion 11. Alternatively, another conducting member may be disposed to replace the directly connected portion. The conducting portion 11 is provided, considering the conducting phenomenon that may take place between the nMOS 101 and the pMOS 102 in the actual CMOS 100A, and the size thereof may be appropriately set.

In the circuit connection step, a network model 100' is connected to the nMOS model 101a and the pMOS model 102a according to the wiring in the network 100 (step S3). The network model 100' in this specific example corresponds to the network portion excluding the CMOS 100A in the network 100 shown in FIG. 2A. In the example shown in FIG. 1, the network model 100' is connected to electrodes 12a through 12c provided on the source 107a, the gate 105a and the drain 106a of the nMOS model 101a, electrodes 12d through 12f provided on a source 107a', a gate 105a' and a drain 106a' of the pMOS model 102a, and an electrode 12g provided on the bottoms of the two models 101a and the 102a that have been connected.

This completes the modeling for the complex simulation of the CMOS 100A and the network 100.

Figure 4:
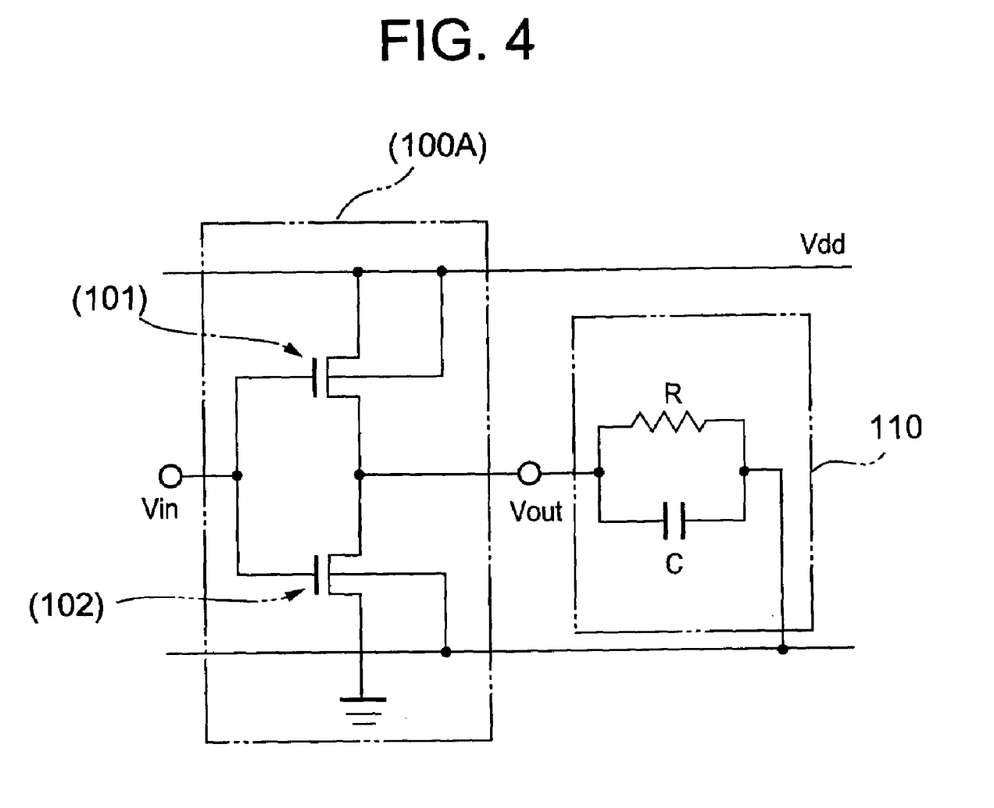
FIG. 4 is a schematic representation for explaining a connection example of a load circuit in the first specific example.

The network model 100' may include, in addition to the aforesaid network portion, the circuit portion replacing the configurational effect from the three-dimensional to the two-dimensional configuration of the CMOS 100A. As the circuit portion, a load circuit 110 using a resistance element and a capacitance element, for example, may be used, as shown in the circuit diagram related to the CMOS 100A shown in FIG. 4. The load circuit 110 is connected to an output terminal (Vout terminal) connecting the drain 106 of the nMOS 101 and the source 107 of the pMOS 102 in the CMOS 100A. To reflect this condition in the network model 100' shown in FIG. 1, the load circuit model 110' that models the load circuit 110 is added to the network model 100' connected to the electrodes 12c and 12d. This makes it possible to compensate for the configurational effect whereby the CMOS 100A has been represented by the two-dimensional device model.

Preferably, the value of the current between the device and the network is preferably standardized in the complex simulation handling the two-dimensional device model, as shown in FIG. 1. For example, it is assumed that current a0 from the network model 100' connected to the electrodes 12c and 12d is supplied to the nMOS model 101a and the pMOS model 102a as In [A] and Ip [A], respectively, in the configuration shown in FIG. 1. At this time, standardized current a1 to the nMOS model 101a will be a1=In/Wn [A/$\mu$m] obtained by dividing the current In by channel width Wn. Similarly, standardized current a2 to the pMOS model 102a will be a2=Ip/Wp [A/$\mu$m].

According to the modeling method of the first specific example, when performing a complex simulation focused on the CMOS 100A in the network 100, the nMOS model 101a and the pMOS model 102a of the CMOS 100A are integrated into the same analysis region. This makes it possible to avoid complicated adjustment of the interface between the device analysis and the circuit analysis in generating a source code.

SECOND SPECIFIC EXAMPLE

Figure 5:
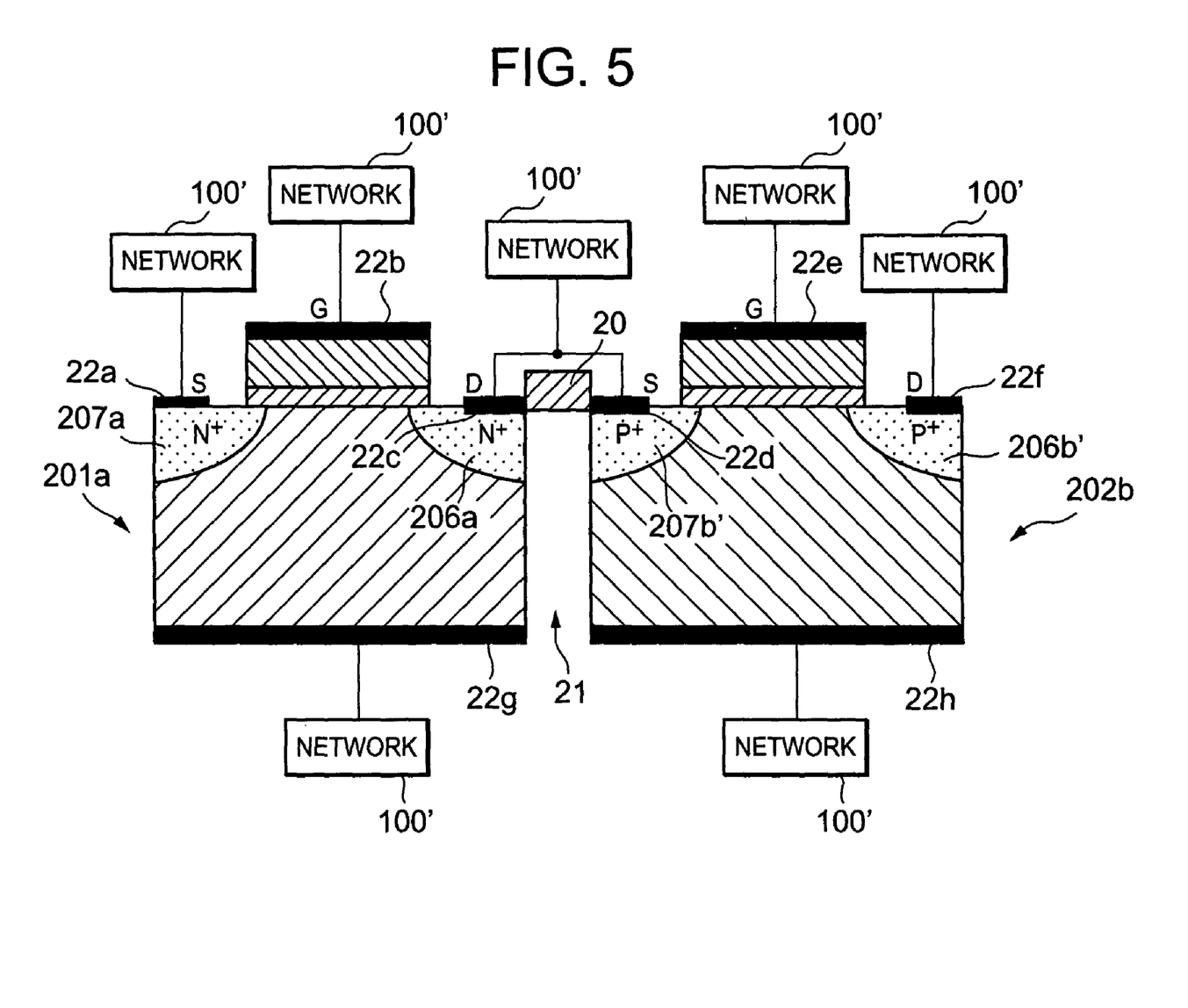
FIG. 5 is a schematic representation for explaining a second specific example of the modeling method in accordance with the present invention.

FIG. 5 is a schematic representation for explaining a second specific example of the modeling method in accordance with the present invention. In the first specific example discussed above, the modeling example of the complex simulation focused on a pair of devices virtually connected in the network, as in the CMOS 100A, has been shown. This specific example focuses on a plurality of devices provided with intervals among them in a network. As an example, attention will be paid to the CMOS 100A of an inverter circuit in the network 100 in FIG. 2A explained in the first specific example and a CMOS 100B of another inverter circuit provided through the intermediary of a plurality of circuits from the above inverter circuit. The configuration of the CMOS 100B has the same configuration as that of the CMOS 100A shown in FIG. 2B, so that the CMOS 100B will not be shown.

Referring to FIG. 5, according to the modeling method of the second specific example, an nMOS model 201a corresponding to the nMOS 101 of the CMOS 100A and a pMOS model 202b corresponding to a pMOS (not shown) of the CMOS 100B are horizontally arranged side by side, and these two models are connected through the intermediary of an insulating portion 20 composed of an insulating constituent, such as SiO$_2$.

The size of the insulating portion 20 is set such that a space 21 for providing a gap between the nMOS model 201a and the pMOS model 202b when the two models are connected. The insulating portion 20 is disposed between an electrode 22c on a drain 206a in the nMOS model 201a and an electrode 22d on a source 207b' of the pMOS model 202b. Then, the network model 100' is connected to electrodes 22a through 22h of the nMOS model 201a and the pMOS model 202b to complete the modeling. Thus, providing the space 21 for filling the gap between the models 201a and 202b with air makes it possible to enhance the electrical isolation between the two models.

As a modification example related to the second specific example, an insulating portion (20) having a size for filling the gap between the nMOS model 201a and the pMOS model 202b may be disposed, instead of providing the aforesaid space 21. The devices to be focused upon in the network are not limited to the combination of the n-type MOS transistor and the p-type MOS transistor as in the illustrated example; they may be appropriately selected. In such a case, the connection of the network models is set, taking the connecting configuration of the selected devices into account.

According to the modeling method in the second specific example, the same advantage as that explained in conjunction with the first example discussed above can be obtained for a plurality of devices provided with intervals among them in a network to be analyzed. Moreover, the space 21 provided between the nMOS model 201a and the pMOS model 202b introduces a so-called reflective boundary condition, leading to enhanced electrical isolation between the two models. This makes it possible to accurately model the condition in which the devices to be analyzed are provided with intervals among them in an actual network.

APPLICATION EXAMPLE

Figure 6:
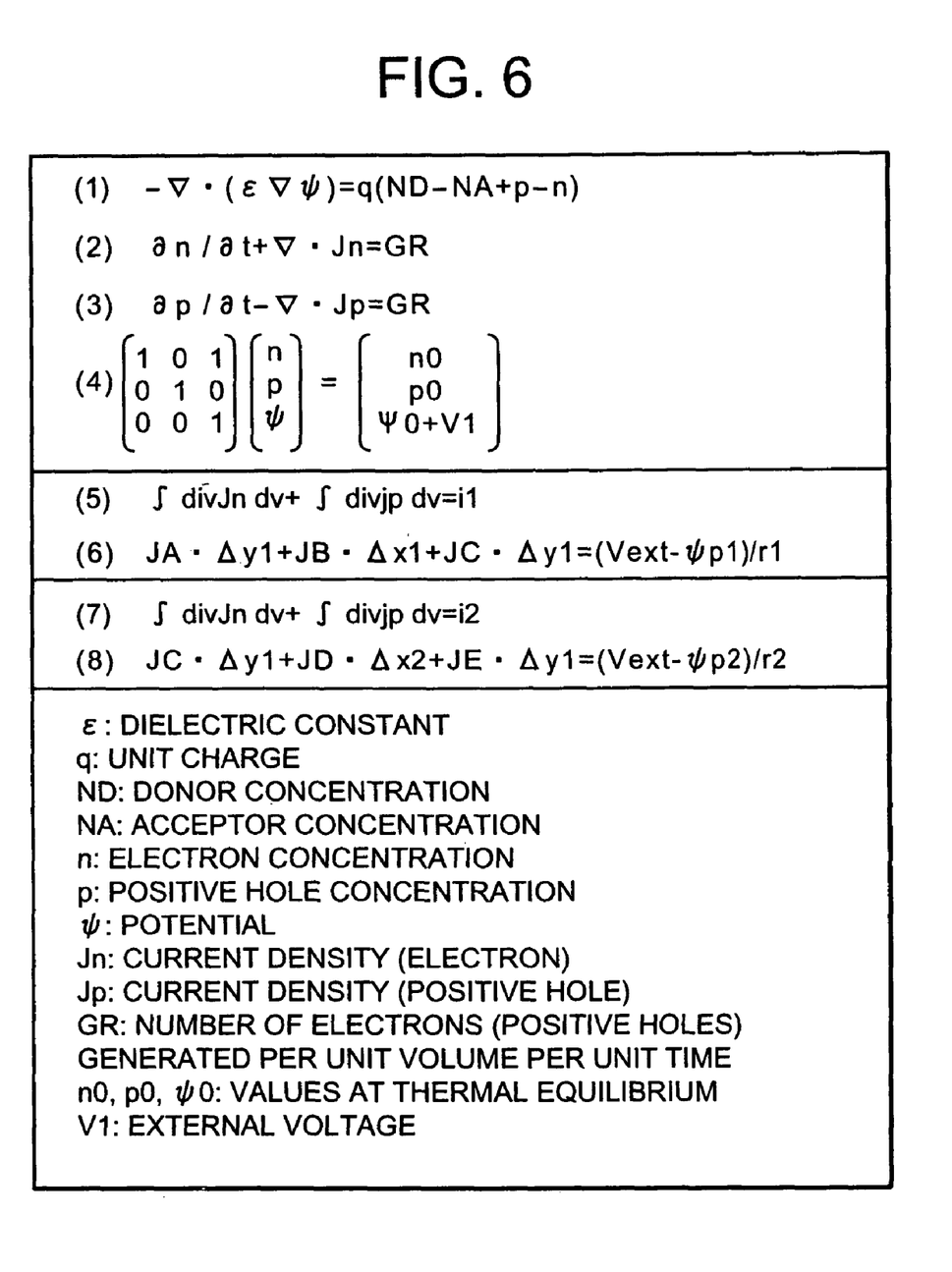
FIG. 6 is a schematic representation for explaining an application example of the modeling method in accordance with the present invention.

In general numerical computation for a device analysis, on each of the potential points assumed to be arranged in a grid pattern on a device model, digitization and linearization are carried out on variables, such as a potential and electron/positive hole concentration, by using the Poisson's equation and a semiconductor governing equation consisting of the current continuity equation of electrons and positive holes shown in FIGS. 6(1) through 6(3). Then, the large-scale matrix calculation covering the variables of all potential points is performed to determine the approximate solutions of the variables at individual potential points. When carrying out the numerical calculation, the voltage fixing boundary condition defined by the determinant indicated in FIG. 6(4) is applied to the electrodes of the device model, and the potentials at all potential points on the electrodes are set to the same value.

If, however, a salicide resistor, for example, is considered, then the potentials at the potential points in the electrodes of the device model vary, and proper analysis results may not be obtained even if the voltage fixing boundary condition set forth above is applied.

A setting example of the electrodes in the device models for modeling an device and a network according to the modeling method shown in the first and second specific examples will be explained. In the electrode potential setting step of the modeling method in accordance with the present invention, attention will be focused on potential points p1 and p2 of an electrode 30 (FIG. 7), which is similar to the electrodes 12a through 12g in the first specific example (FIG. 1) or the electrodes 22a through 22h in the second specific example (FIG. 5).

Figure 7:
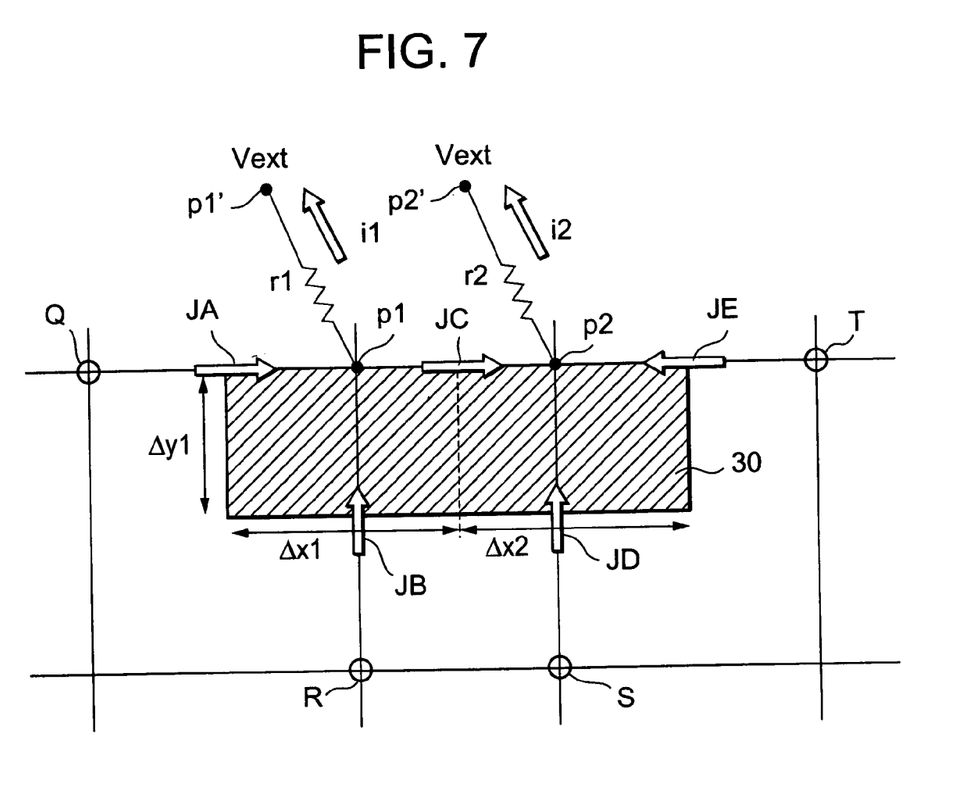
FIG. 7 is a schematic representation for explaining a setting example of the electrode portion in the application example.

Referring to FIG. 7, JA denotes the density of the current supplied from a potential point Q to a potential point pl. Similarly, JB denotes the density of the current supplied from a potential point R to the potential point p1, JC denotes the density of the current supplied from the potential point p1 to the potential point p2, JD denotes the density of the current supplied from a potential point S to the potential point p2, and JE denotes the density of the current supplied from a potential point T to the potential point p2. These current densities JA through JE involve both electrons and positive holes. The values of resistors r1 and r2 assumed to be present between the potential points p1 and p2 and between virtual potential points p1' and p2' may be appropriately set as the values of additional resistors, such as salicide resistors.

It is assumed that, at the setting set forth above, the current flowing into the electrode 30 is equivalent to a current i1 flowing from the potential point p1 to the potential point p1' due to the resistor r1. In other words, it is assumed that no current loss occurs at the electrode 30. At this time, a current i1 can be defined by expression (5) shown in FIG. 6, and a current i2 flowing from the potential point p2 to the potential point p2' due to the resistor r2 can be defined by expression (7). Current densities (Jn, Jp) of the electrons and the positive holes in expressions (5) and (7) preferably take the fixed values determined from an approximate expression assuming thermal equilibrium.

When the shape, current density, etc. of the electrode 30 shown in FIG. 7 are reflected in expressions (5) and (7) described above, the relational expression shown in FIG. 6(6) on current i1 can be derived from expression (5). On the other current i2, expression (8) can be derived from expression (7). In the derived expressions (6) and (8), $\phi$p1 and $\phi$p2 indicating the potentials at the potential points p1 and p2 on the electrode 30 are defined as independent variables, and the values that are different from each other ($\phi$p1≠$\phi$p2) are set for the independent variables.

Regarding the electrodes in the device models, providing the setting set forth above allows a difference to be imparted between the potential points on the electrode, making it possible to successfully handle electrodes, such as the ones requiring considerations to a salicide resistor, to which the voltage fixing boundary condition can be hardly applied. Moreover, the potentials at the individual potential points can be independently set, permitting an increased degree of freedom in the numerical calculation. This advantageously makes it possible to easily obtain a convergent solution in a device analysis.

The first and second specific examples of the modeling method in accordance with the present invention described above have shown the cases where a pair of two-dimensional models are connected to integrate a plurality of analysis regions; the scope of the present invention, however, is not limited to thereto. The number of the devices to be analyzed is not limited to two; three or more arbitrary device models can be integrated into a single analysis region, as long as a plurality of device models are interconnected according to the procedures of the specific examples discussed above. Furthermore, the device models are not limited to two-dimensional; the present invention can be applied to three-dimensional models showing the three-dimensional structures of devices. In such a case, there is no need to standardize the currents discussed in the first specific example.

The modeling method in accordance with the present invention allows a plurality of device models to be connected through the intermediary of an insulating portion and integrated into a single analysis region. This arrangement makes it possible to avoid the complication of the adjustment of the interface between the analysis of a device and the analysis of a circuit in generating a source code. In other words, the modeling method according to the present invention obviates the need for the significant adjustment of an interface in the prior arts, and it enables a complex simulation to be accomplished simply by changing the handling of electrodes in a general-purpose source code for device analyses.

What is claimed is:

1. A method for modeling a device and a network to be analyzed in a complex simulation for analyzing, in a complex fashion, a semiconductor device and a network that includes the device, the method comprising:
   a device extraction step for extracting the structure of each of a plurality of devices included in the network to create device models showing the individual extracted structures;
   a device connection step for connecting the respective device models through the intermediary of an insulating portion for cutting off the electrical connection between the respective device models; and
   a circuit connection step for connecting a network model showing the network portion, from which the plurality of devices extracted in the device extraction step have been excluded, to a predetermined device model among the connected device models.

2. The modeling method according to claim 1, wherein, in the device extraction step, two-dimensional models showing the sectional structures of the individual corresponding devices are used as the device models.

3. The modeling method according to claim 1, wherein, in the device extraction step, the models showing the three-dimensional structures of the corresponding devices are used as the device models.

4. The modeling method according to claim 1, wherein, in the device connection step, the device models are connected through the conducting portions that permit partial conduction among the device models to be connected.

5. The modeling method according to claim 1, wherein, in the device connection step, space portions are formed to provide a gap between device models to be connected.

6. The modeling method according to claim 1, further comprising an electrode potential setting step for setting potentials, which are different from each other, at predetermined multiple potential points in an electrode of a device model to which the network portion has been connected.

* * * * *